(12) United States Patent
Christoph

(10) Patent No.: US 7,287,050 B2
(45) Date of Patent: Oct. 23, 2007

(54) PARAMETRIC RECURSIVE DIGITAL FILTER

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 636 days.

(21) Appl. No.: 10/675,600

(22) Filed: Sep. 29, 2003

(65) Prior Publication Data

US 2004/0193666 A1    Sep. 30, 2004

(30) Foreign Application Priority Data

Sep. 27, 2002   (EP)   ................. 02 021 903

(51) Int. Cl.
*G06F 17/10*   (2006.01)
(52) U.S. Cl. ....................................... 708/320
(58) Field of Classification Search ................. 708/320
See application file for complete search history.

(56) References Cited

U.S. PATENT DOCUMENTS 5,325,318 A * 6/1994 Harris et al. ................ 708/313
5,808,924 A * 9/1998 White ........................ 708/313
5,926,455 A * 7/1999 Allpress ..................... 370/210

OTHER PUBLICATIONS

Schüssler et al., "Variable Digital Filters," Arch. Elekt. Übertr., vol. 24, issue 11, pp. 524-525.
Karjalainen et al., "Realizable Warped IIR Filters and their Properties," IEEE, pp. 2205-2208, 1997.

* cited by examiner

*Primary Examiner*—Tan V. Mai
(74) *Attorney, Agent, or Firm*—O'Shea, Getz & Kosakowski, P.C.

(57) ABSTRACT

A digital filter includes a delay network with a plurality of delay elements configured and arranged as all-pass filters, having a controllable coefficient value. In the case of a low-pass or high pass filter, the cut-off frequency of the filter can be controlled via the controllable coefficient value associated with phase angle. Similarly, in a bandpass filter, the center frequency is set as a function of the controllable coefficient value.

10 Claims, 11 Drawing Sheets

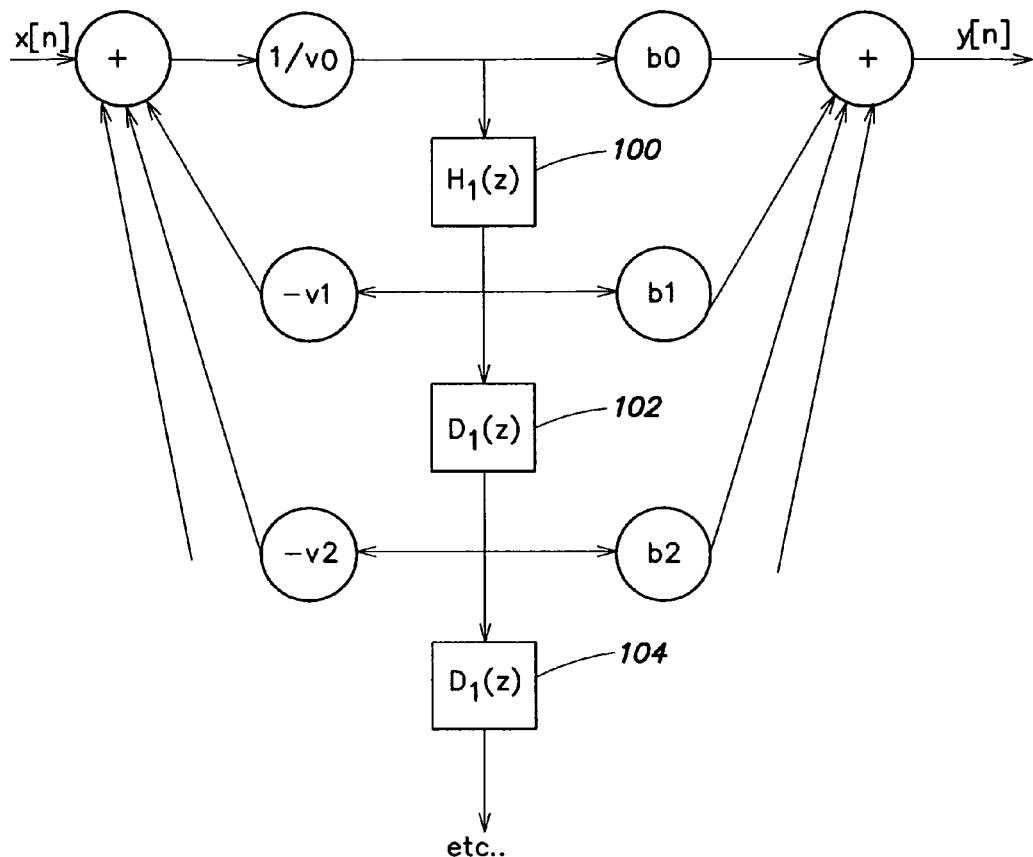
FIG. 9
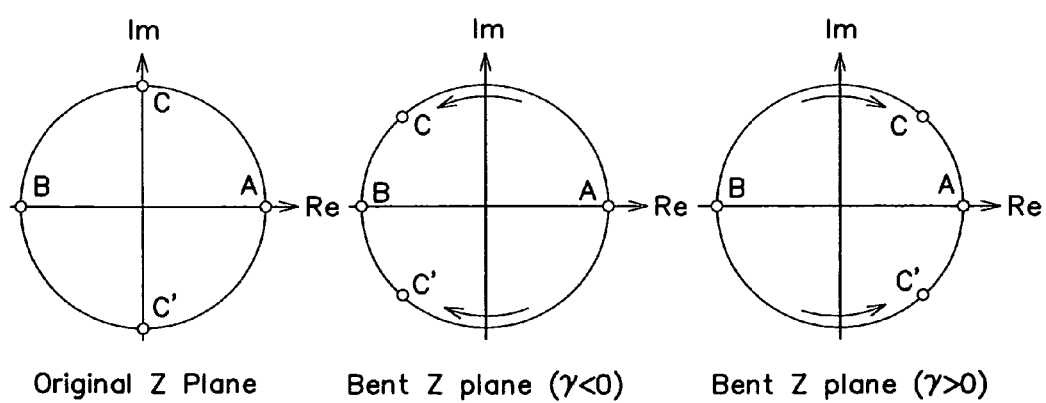
Original Z Plane
FIG. 10A
Bent Z plane ($\gamma < 0$)
FIG. 10B
Bent Z plane ($\gamma > 0$)
FIG. 10C

PARAMETRIC RECURSIVE DIGITAL FILTER

CLAIM OF PRIORITY

This patent application claims priority to European Patent Application serial number 02021903.6 filed on Sep. 27, 2002.

FIELD OF THE INVENTION

This invention relates to the field of signal processing, and in particular to a parametric recursive digital filter.

RELATED ART

As known, digital filters include at least one delay unit and a coefficient network, which determine the cut-off/center frequency (i.e., $f_c$) of the filter. In some applications it is desirable to change the cut-off or center frequency of a filter in response to a control quantity (parametric filter).

In conventional digital filters, the cut-off or center frequency is controlled with either the aid of coefficient look-up tables or real-time calculation of the filter coefficients. However, known structures for implementing the coefficient look-up tables and/or the real-time calculation require a rather large amount of memory and/or increased computational ability. This is of course particularly true in the case of higher-order filters. W. Schüssler, W. Winkelnkemper, suggest in the publication entitled "*Variable Digital Filters*", Arch. Elektr. Übertr., Vol. 24, 1970, issue 11, pages 524-525, an arrangement in which the delay elements of a conventional digital filter are replaced by all-pass filters in order to obtain a parametric filter. However, the authors of this publication concede that this procedure cannot be implemented in digital filters because the all-pass filters comprise an attenuation when the highest all-pass filter coefficient is not equal to zero. As a solution for this problem, it is suggested either to use only all-pass filters in which the highest all-pass filter coefficient is equal to zero or only to use non-recursive filter structures. A problem with the proposed solution is that few filters can be implemented so that the possible applications are very limited.

Therefore, there is a need for a parametric recursive digital filter.

SUMMARY

The cut-off frequency or center frequency of a digital filter may be controlled by changing a coefficient value within a delay unit of the filter. A linear relationship exists between the coefficient value and the cut-off or center frequency of the recursive digital filter.

The digital filter may be implemented with a recursive filter structure, such as for example digital wave filter structures. A filter element with a controllable phase angle (e.g., all-pass filter) is provided as the delay unit.

In complex filters and higher-order filters, a plurality of delay units may be used, and the delay units formed by identical filter elements selected in the same manner. As a result, the filter elements have the same coefficient value so coefficient calculation only needs to be performed once and can be used for all the filter elements.

In one embodiment, the delay unit may include an all-pass filter. The delay unit may include a first adder, one input of which forms the input of the delay unit, and a second adder, the output of which forms the output of the delay unit. A coefficient section is connected between the output of the first adder and a first input of the second adder. A first delay element is connected between the input of the delay unit and a second input of the second adder, and a second delay element is connected between the output of the delay unit and a second input of the first adder. The phase angle of the filter element may be adjusted by changing the coefficient of the coefficient section, and the output of the first and/or second delay element being provided for connecting a feedback path. In addition to this all-pass filter embodiment, other embodiments of an all-pass filter may also be used.

To simplify the structure of one embodiment of the all-pass filter, two delay units comprising delay elements can be interconnected with one another (in each case) in such a manner that only a total of three delay elements are provided, one delay element being used for both delay units.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

FIG. 9 is a block diagram illustration a parametric infinite impulse response filter with a low-pass filter as the first delay unit;

FIGS. 10A-10C illustrate a series of coordinate patterns illustrating the pole-zero shift in the Z domain as a function of the all-pass filter parameter γ in a second-order parametric IIR filter structure;

DETAILED DESCRIPTION

A digital filter includes delay elements configured and arranged as all-pass filters (e.g., first-order low pass filters). The all-pass filter may be referred to as a frequency distorting filter since the specifications of the filter are often implemented on a distorted non-uniform frequency axis.

A shift in the amplitude/frequency response |H(z)| of the filter can be achieved if z is replaced or mapped by an expression W(z), where W(z) meets the following conditions:
(i) the inside of the unit circle (Z plane) must be mapped again to the inside of the inner circle; and
(ii) the unit circle must be mapped to itself.

Condition (i) specifies that if H(z) is stable, H(W(z)) is also stable. The second condition makes it possible to shift (i.e., "map") the amplitude/frequency response into another arbitrary frequency range.

W(z) is the transfer function for an all-pass filter. The amplitude/frequency response |H(z)| of the all-pass filter is constantly equal to one, which ensures that the amplitude/frequency response of the overall filter is not changed and that the first condition (i) is satisfied. Thus, a displacement or bending of the frequency axis occurs, and the displacement is controlled by the filter coefficient of the first-order all-pass filter. As a result, the filter coefficient value γ of the first-order all-pass filter is also called the frequency curvature parameter.

Figure 1A:
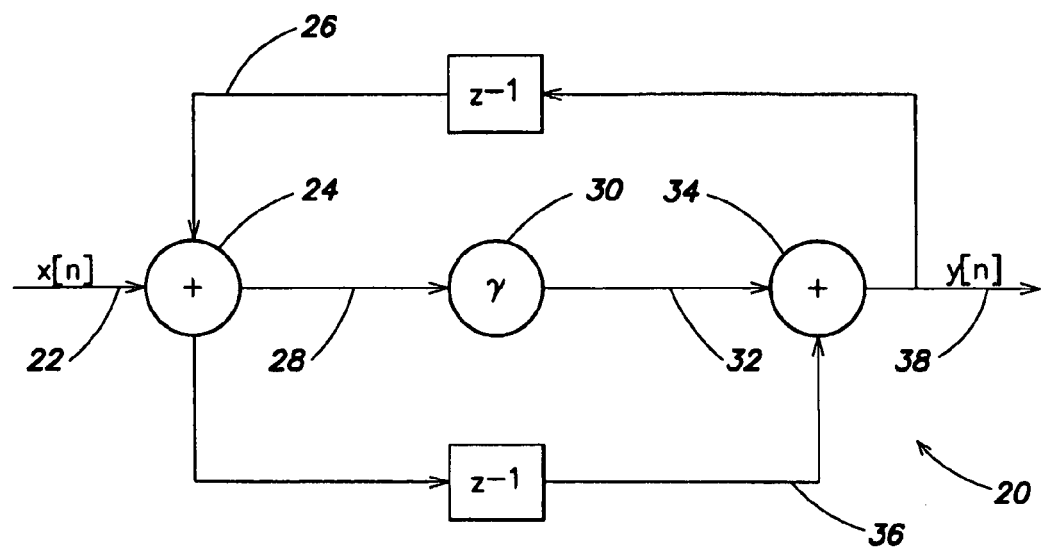
FIGS. 1A and 1B are block diagram illustrations of two first-order all-pass filters.
Figure 1B:
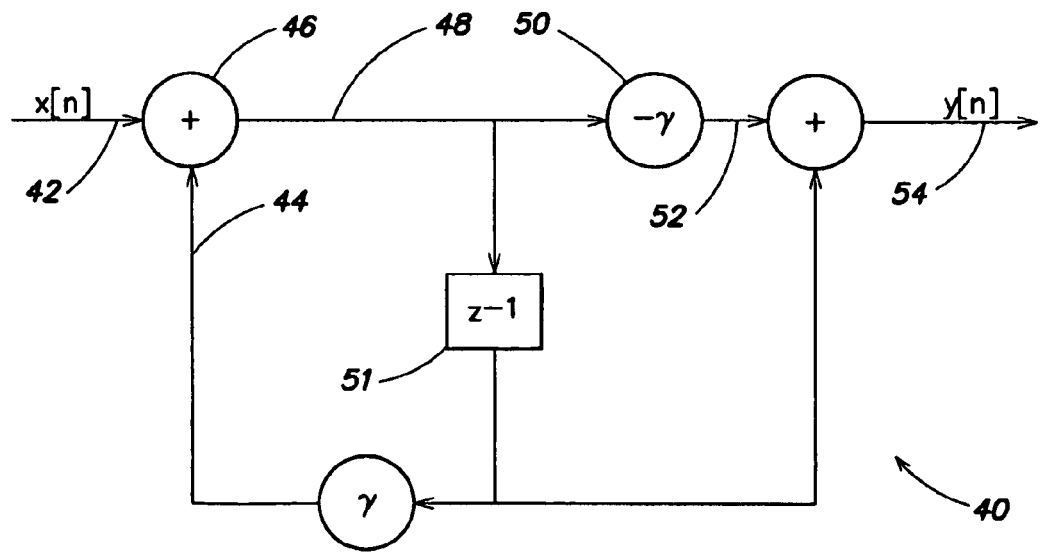

FIGS. 1A and 1B are block diagram illustrations of first-order all-pass filters. FIG. 1A illustrates a first order all-pass filter 20 that receives an input signal sequence x[n] on a line 22. A summer 24 receives the input signal on the line 22 and the past value of the output signal y[n−1] on line 26, and provides the resultant sum on line 28. The sum is input to a coefficient section 30, which multiplies the summed signal on the line 28 by the coefficient value γ. The product is output on line 32 to the summer 34, which also receives a signal on line 36 indicative of the past value of the signal on the line 28. The summer 34 provides the output signal y[n] on line 38.

FIG. 1B illustrates another first order all-pass filter 40. This filter receives the input signal x[n] on line 42 and sums this signal with a coefficient weighted feedback signal on line 44. A summer 46 provides a summed value on line 48, which is input to a coefficient multiplier 50 that multiplies the signal on the line 48 with the coefficient value −γ, and a delay element 51. The resultant product is output on line 52 and summed with a delayed version of the signal on the line 48, to provide the output signal y[n] on line 54.

A first-order all-pass filter has the following transfer function:

$$W(z) = \frac{1 - \gamma * z^{-1}}{z^{-1} - \gamma} \qquad \text{EQ. 1}$$

The first-order all-pass filter changes its phase response as a function of the all-pass parameter γ, which can move within a range of −1<γ<+1. The change of this frequency response corresponds to bending of the frequency axis or mapping into a new frequency range.

Figure 2:
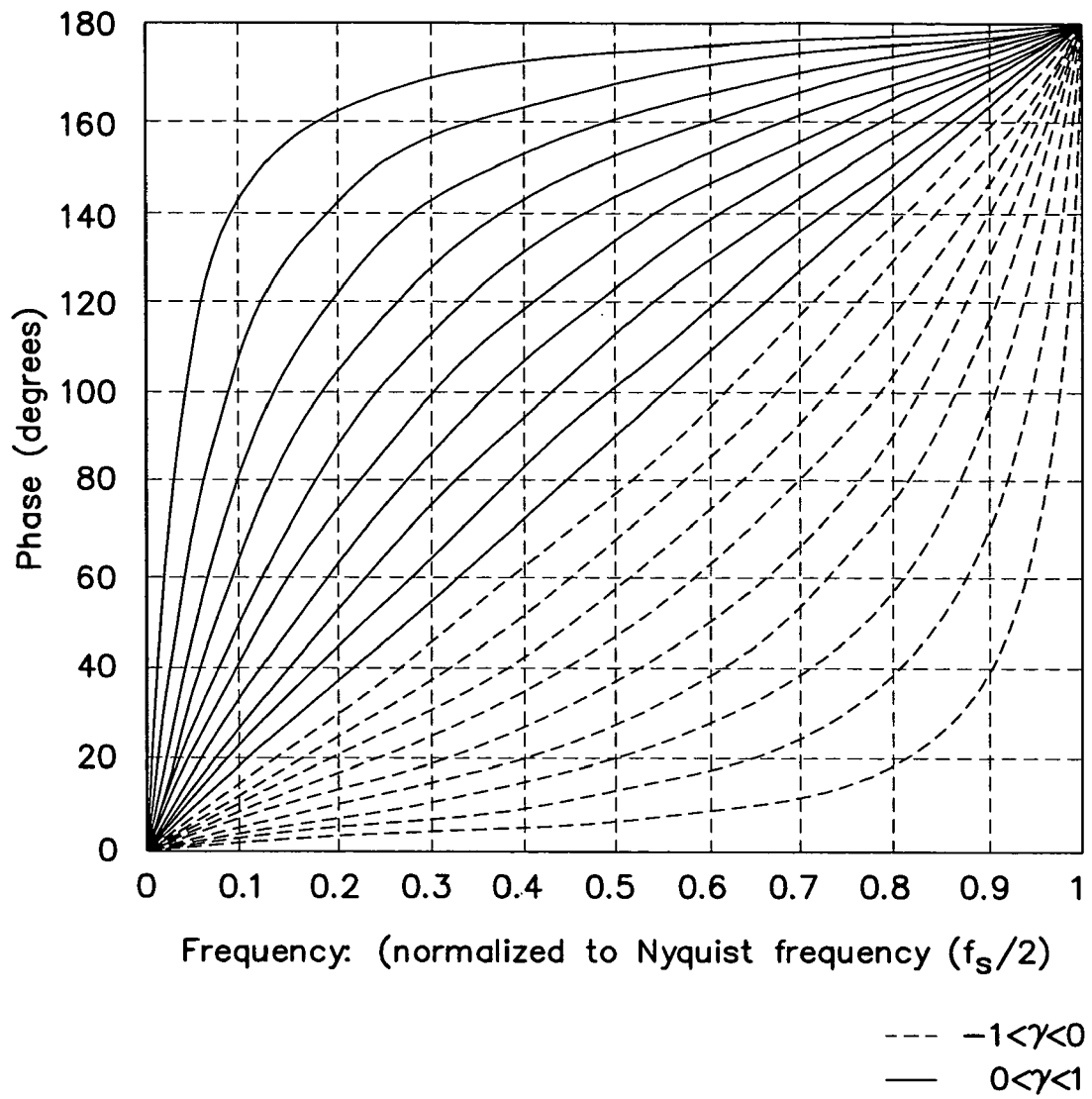
FIG. 2 is a graph illustrating the phase response/frequency bending function, of a first-order all-pass filter as a function of the all-pass filter coefficient.

FIG. 2 shows the frequency response/frequency bending function of the first-order all-pass filter as a function of the all-pass coefficient/frequency curvature parameter γ. Phase in degrees is plotted along the vertical axis, while normalized frequency (i.e., frequency with respect to the sampling frequency $f_s$ divided by two) is plotted along the horizontal axis. As shown, high frequencies are mapped to low frequencies for negative γ values, and low frequencies are mapped to high frequencies for positive γ values. The greater the amount of γ, the greater the frequency bending. There is no frequency bending for the coefficient value γ=0—that is, the frequency axis is mapped to itself again in this case (bisector).

Since delay elements in traditional filter structures do not appear in the form of z but in the form of $z^{-1}$, it is also appropriate for filters with frequency bending to work not with W(z), but with $W^{-1}(z)$. In this way, it is impossible to replace all delay elements $z^{-1}$ with their frequency-dependent counterpart:

$$W^{-1}(z) = D(z) = \frac{z^{-1} - \gamma}{1 - \gamma * z^{-1}}. \qquad \text{EQ. 2}$$

Due to the bending of the frequency axis, some frequency ranges are resolved more finely and others more coarsely in dependence on the frequency curvature parameter γ. If a filter has a local frequency resolution of Δf(f) before the "bending", the bent filter has a local frequency resolution of $\Delta f_w(f)$, where the following holds true:

$$\Delta f_w(f) = \Delta f(f_w(f, \gamma)) * \frac{1 - \gamma^2}{1 + \gamma^2 + 2 * \gamma * \cos\left(\frac{2 * \pi * f_w(f, \gamma)}{f_s}\right)} \qquad \text{EQ. 3}$$

where $f_s$ is the sampling frequency and $f_w(f, \gamma)$ stands for a function that specifies the corresponding frequency in the bent frequency range for a given frequency and all-pass parameter. The frequency of the parametric filter as a function frequency f and the all-pass parameter γ can be expressed as:

$$f_w(f, \gamma) = f + \frac{f_s}{\pi} * \arctan\left(\frac{\gamma * \sin\left(\frac{2 * \pi * f}{f_s}\right)}{1 - \gamma * \cos\left(\frac{2 * \pi * f}{f_s}\right)}\right) \qquad \text{EQ. 4}$$

The turning point frequency $f_{tp}$ is the frequency that the frequency resolution of the parametric filter is the same as before the frequency bending. It can be shown that the following holds true for $f_{tp}$:

$$f_{tp} = \frac{f_s}{2 * \pi} * \arccos(\gamma) \qquad \text{EQ. 5}$$

Figure 3:
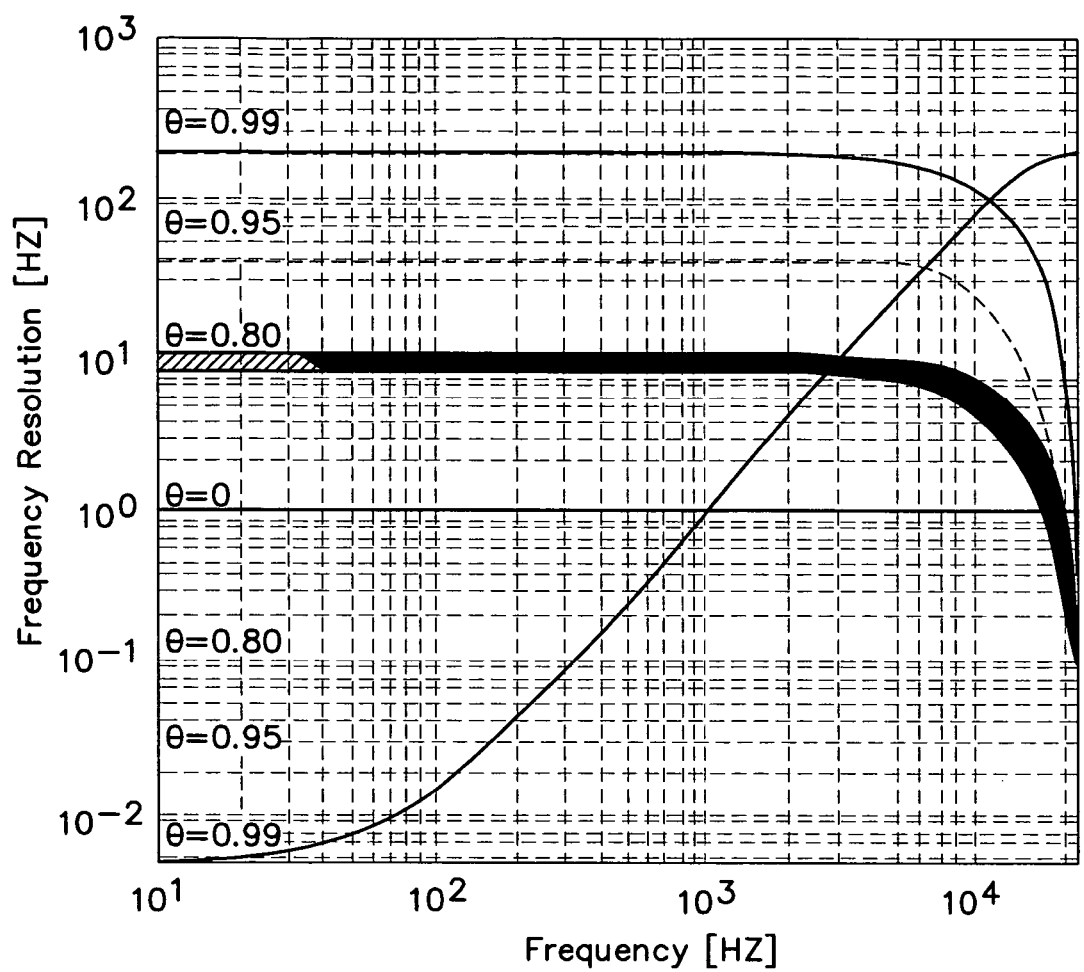
FIG. 3 is a graph illustrating the frequency resolution of a parametric filter for various all-pass filter parameters γ.

For frequencies less than $f_{tp}$, the frequency resolution is improved with a positive γ. The frequency resolution decreases for negative γ. FIG. 3 illustrates the frequency resolution of the parametric filter for various all-pass parameters γ. The turning point frequency $f_{tp}$ is given when the frequency resolution is equal to one.

Figure 4:
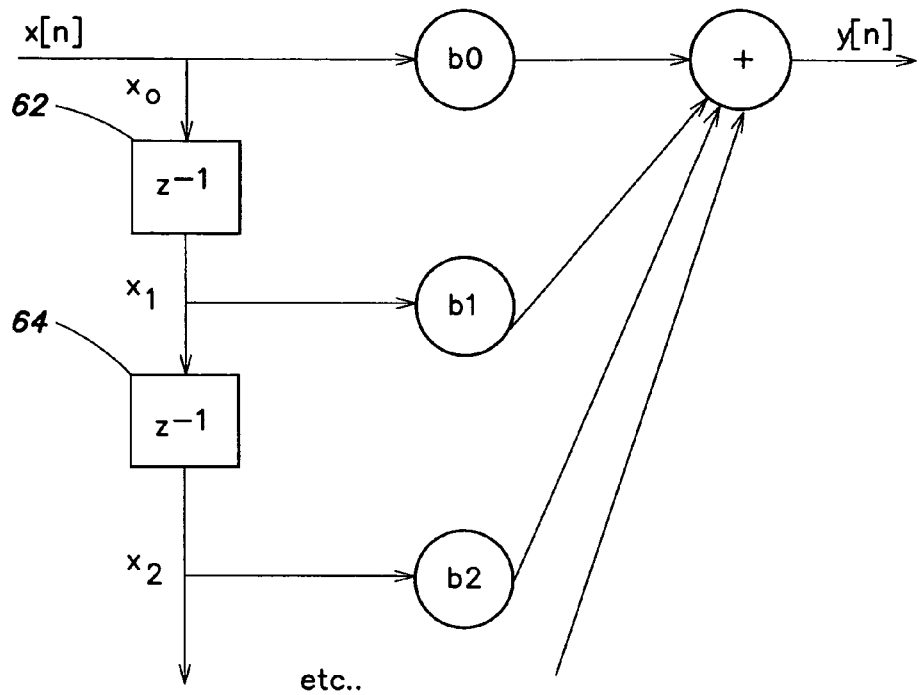
FIG. 4 is a block diagram illustration of a prior art finite impulse response (FIR) filter.

FIG. 4 is a block diagram illustration of a prior art finite impulse response (FIR) filter. The filter includes delay elements 62, 64. A frequency-bending FIR filter is obtained by replacing the delay elements 62, 64 (FIG. 4) with frequency-dependent delay elements 66, 68 having a transfer function D(z), as shown in FIG. 5.

Figure 5:
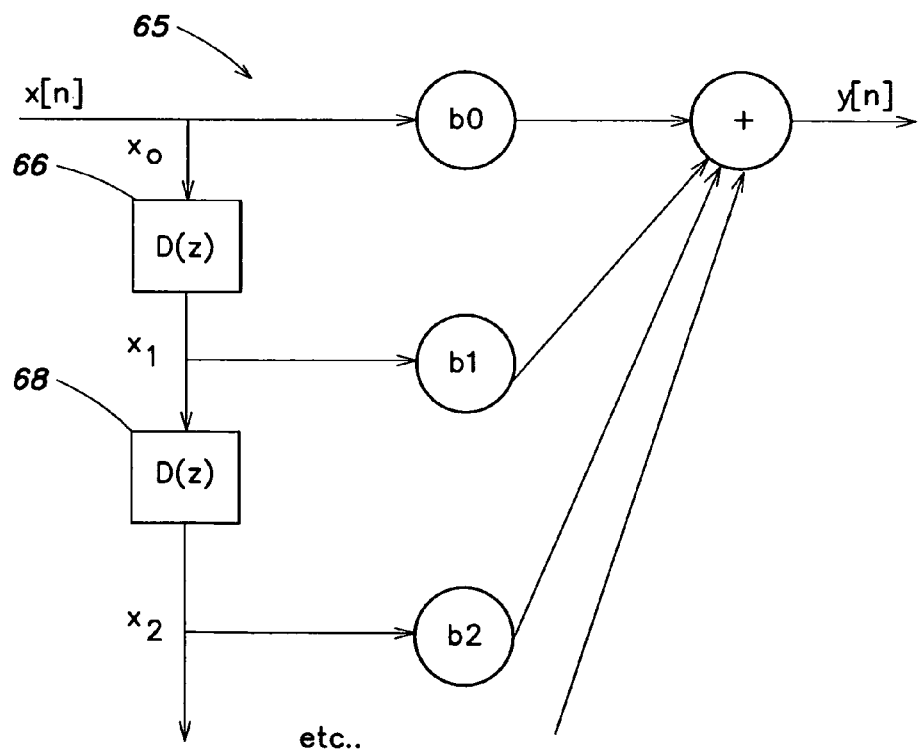
FIG. 5 is a block diagram illustration of a parametric finite impulse response filter.

FIG. 5 is a block diagram illustration of a parametric finite impulse response (FIR) filter 65. If the frequency-dependent delay sections 66, 68 are replaced by their corresponding all-pass filter structure (e.g., by the structure shown in FIG. 1A), and the structure is simplified by dissolving redundant branches, a computationally efficient structure of a frequency-bending FIR filter is obtained as illustrated in FIG. 6.

Figure 6:
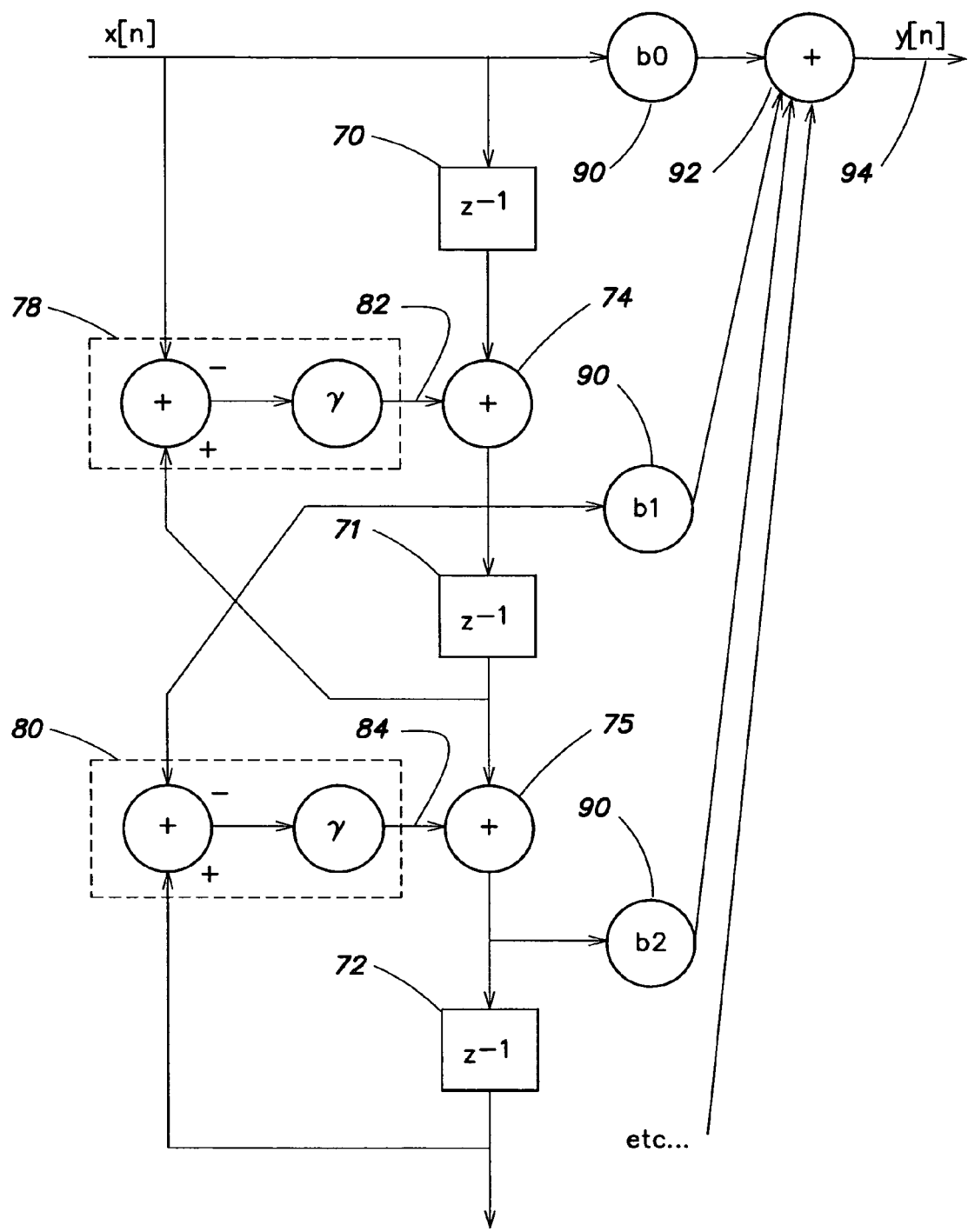
FIG. 6 is a detailed block diagram illustration of a computationally efficient structure for the parametric FIR filter illustrated in FIG. 5.

FIG. 6 is a detailed block diagram illustration of a computationally efficient embodiment for the parametric FIR filter illustrated in FIG. 5. The filter includes a plurality of series-connected delay elements (e.g., 70-72), summing nodes 74, 75 each inserted between two delay elements, and coefficient sections 78, 80. The input signals for the coefficient sections 78, 80 are picked up at the input of the delay element 70, the output of the summing node 74, and output of delays 71, 72. The coefficient sections 78, 80 include a programmable/adjustable coefficient value γ. The coefficient sections 78, 80 provide coefficient section output signals on line 82, 84, respectively, which are summed with associated delay element output signals to provide output signals to a multiplication network 90. Products from the multiplication network 90 are input to a summer 92, which provides an output signal on line 94.

Figure 7:
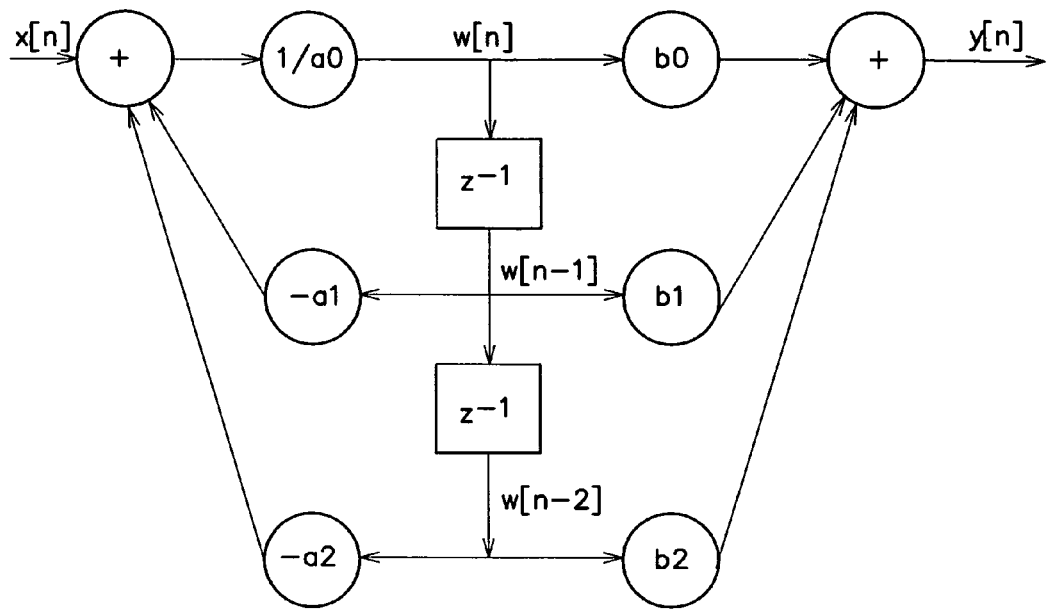
FIG. 7 is a block diagram illustration of a prior art biquad filter as an example of a second-order infinite impulse response (IIR) filter.
Figure 8:
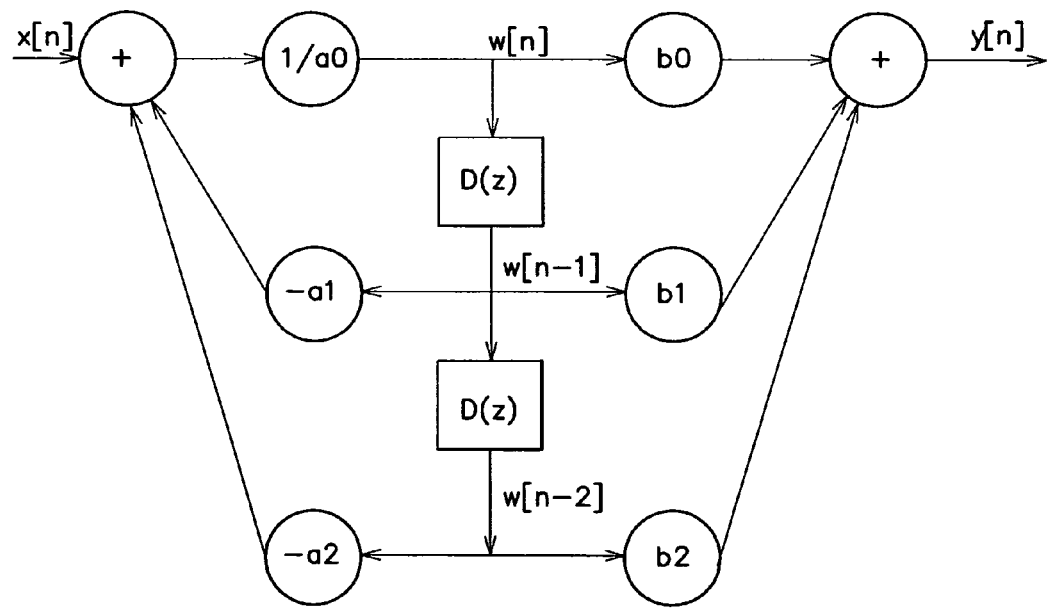
FIG. 8 is a block diagram illustration of the structure of a biquad filter as an example of a second-order infinite impulse response (IIR) filter.

Replacing a delay element in one of the traditional IIR filter structures with a frequency-dependant (dispersive) delay element as has already been explained for the FIR filter provides a structure that contains feedback branches that are free of delay, but which cannot be implemented in this way, as has been explained in the prior art mentioned initially. FIGS. 7 and 8 show a recursive biquad filter before and after the mapping, respectively. FIG. 7 is a block diagram illustration of a prior art biquad filter as an example of a second-order infinite impulse response (IIR) filter. FIG. 8 is a block diagram illustration of a modified biquad filter as an example of a second-order infinite impulse response (IIR) filter. The structure of a frequency-bending IIR filter (i.e., frequency warping IIR filter—WIIR) is obtained by replacing the delay elements illustrated in FIG. 7 with frequency-dependent delay elements 80, 82 having a transfer function D(z), as shown in FIG. 8. FIG. 7 is based on the arrangement illustrated in FIG. 4, and has been expanded by a feedback network.

FIG. 8 illustrates a WIIR filter that is suitable for higher order filters, and provides for all other delay elements apart from the first one to be replaced by first-order all-pass filters D(z). The first delay is replaced by a first-order low-pass filter H(z). This measure makes it necessary to recalculate (to map) the filter coefficients of the original IIR filter to the new structure, which is done by a relatively simple recursive formula. FIG. 9 shows the corresponding frequency mapping/warping IIR filter structure that includes a low-pass filter H(z) 100 and a plurality of first-order all-pass filters D(z) 102, 104.

The digital filters according to an aspect of the present invention include delay elements configured and arranged as all-pass filters (e.g., particularly of the first order). However, to avoid the zero-delay feedbacks, feedback is not effected after the respective dispersive delay units (in the prior art) but, according to the invention, directly after the delay element within a dispersive delay unit. The forward branch (FIR part of the filter) with its coefficients $b_0$, $b_1$, $b_2$ etc. remains unaffected by this measure. We shall now discuss a procedure for designing a second-order frequency-bending IIR filter with the design of a 10 Hz high-pass filter.

Using frequency-bending filters, a fixed "normalized filter" can be designed that has an arbitrary fixed cut-off frequency $f_c$, and which can be displaced into any desired frequency range with the aid of the frequency curvature parameter γ. FIGS. 10A-10C illustrate the pole-zero shift in the Z domain as a function of the frequency curvature parameter γ.

Figure 11:
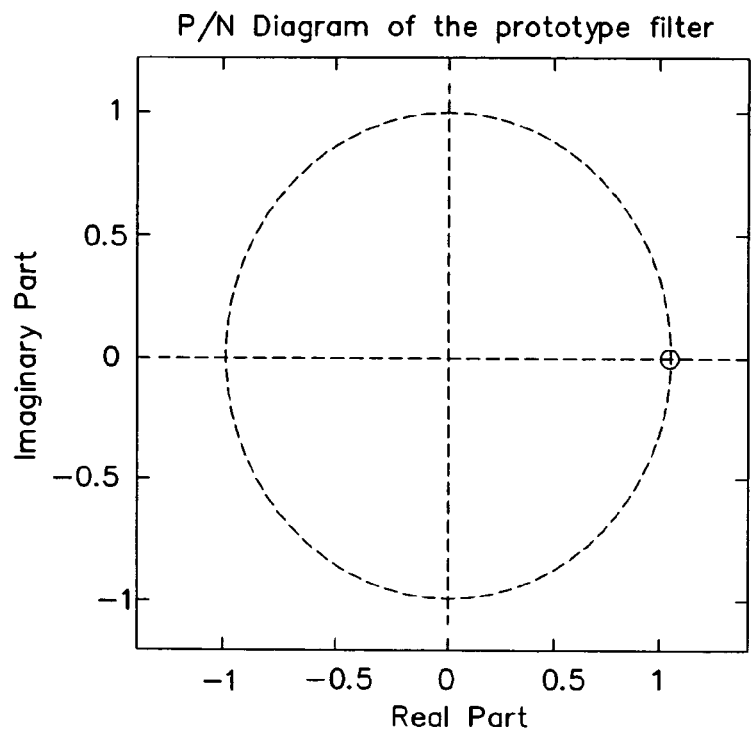
FIG. 11 is a graph illustrating the pole-zero diagram of a normalized filter.
Figure 12:
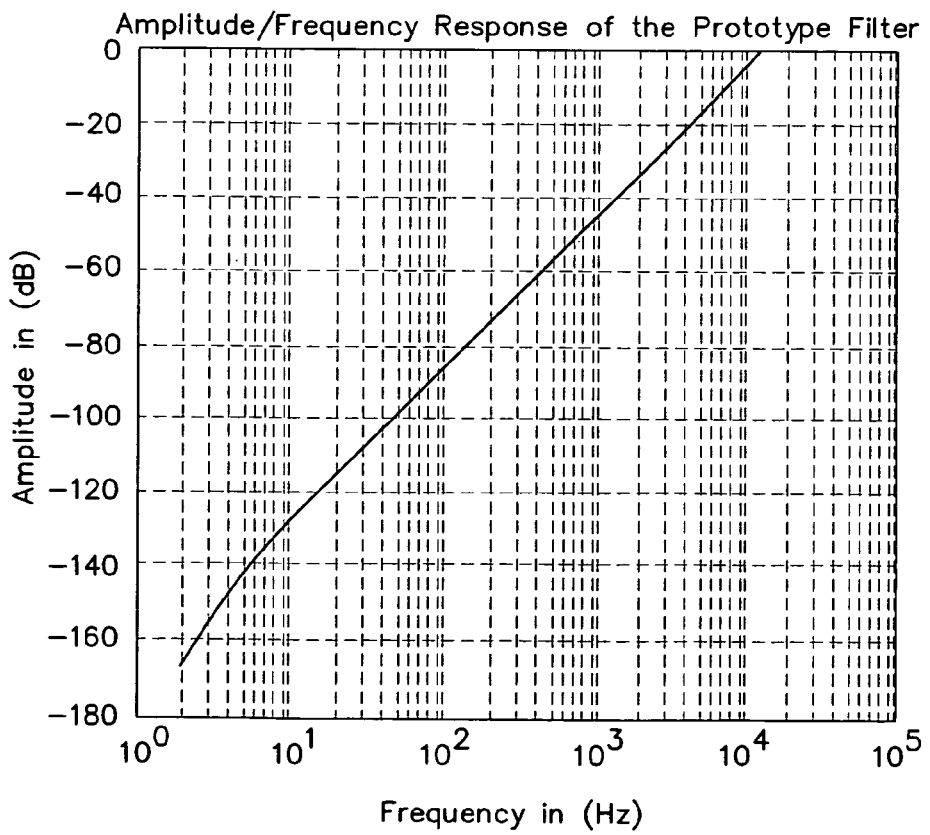
FIG. 12 is a graph illustrating the amplitude/frequency response of the normalized filter.

Since originally filters are assumed that are designed in the direct form, it is appropriate to utilize the advantages of the direct form as far as possible. The frequency range within which the direct form has particularly good characteristics in the sense of quantization sensitivity and dynamic range, is around $f_s/4$. For this reason, the cut-off frequency $f_c$ of the prototype filter is left at $f_c=f_s/4$, where $f_s$ is the sampling frequency. FIGS. 11 and 12 show the associated pole-zero diagram and the amplitude/frequency response of the normalized filter, respectively.

The frequency curvature parameter γ is be calculated so the normalized filter is shifted towards the required cut-off frequency. For this purpose, the equation:

$$f_{pre}(f, \gamma) = f + \frac{f_S}{\pi} * \arctan\left(\frac{\gamma * \sin\left(\frac{2*\pi*f}{f_S}\right)}{1 - \gamma * \cos\left(\frac{2*\pi*f}{f_S}\right)}\right) \quad \text{EQ. 6}$$

can be transformed in such a manner that the frequency curvature parameter γ can be calculated from it. The calculation formula that produces the frequency curvature parameter γ with the aid of the fixed cut-off frequency of the normalized filter $f_{pre}$ and the desired cut-off frequency $f_c$ can be expressed as:

$$\gamma = -\left(\frac{\tan\left(\frac{(f_{pre} - f_c)*\pi}{f_s}\right)}{\sin\left(\frac{2*\pi*f_c}{f_s}\right) + \cos\left(\frac{2*\pi*f_c}{f_s}\right) * \tan\left(\frac{(f_{pre} - f_c)*\pi}{f_s}\right)}\right) \quad \text{EQ. 7}$$

If $f_{pre}$ is left at $f_s/4$, the previous equation is reduced to:

$$\gamma = \tan\left(\frac{\pi}{4} - \frac{f_c * \pi}{f_s}\right) \quad \text{EQ. 8}$$

The expression $f_{pre}$ for the fixed cut-off frequency of the normalized filter was selected since it can be said that this filter is designed in the distorted frequency range. One can return from the distorted frequency range into the original frequency range by operating the parametric filter with the frequency curvature parameters γ calculated above.

Figure 13:
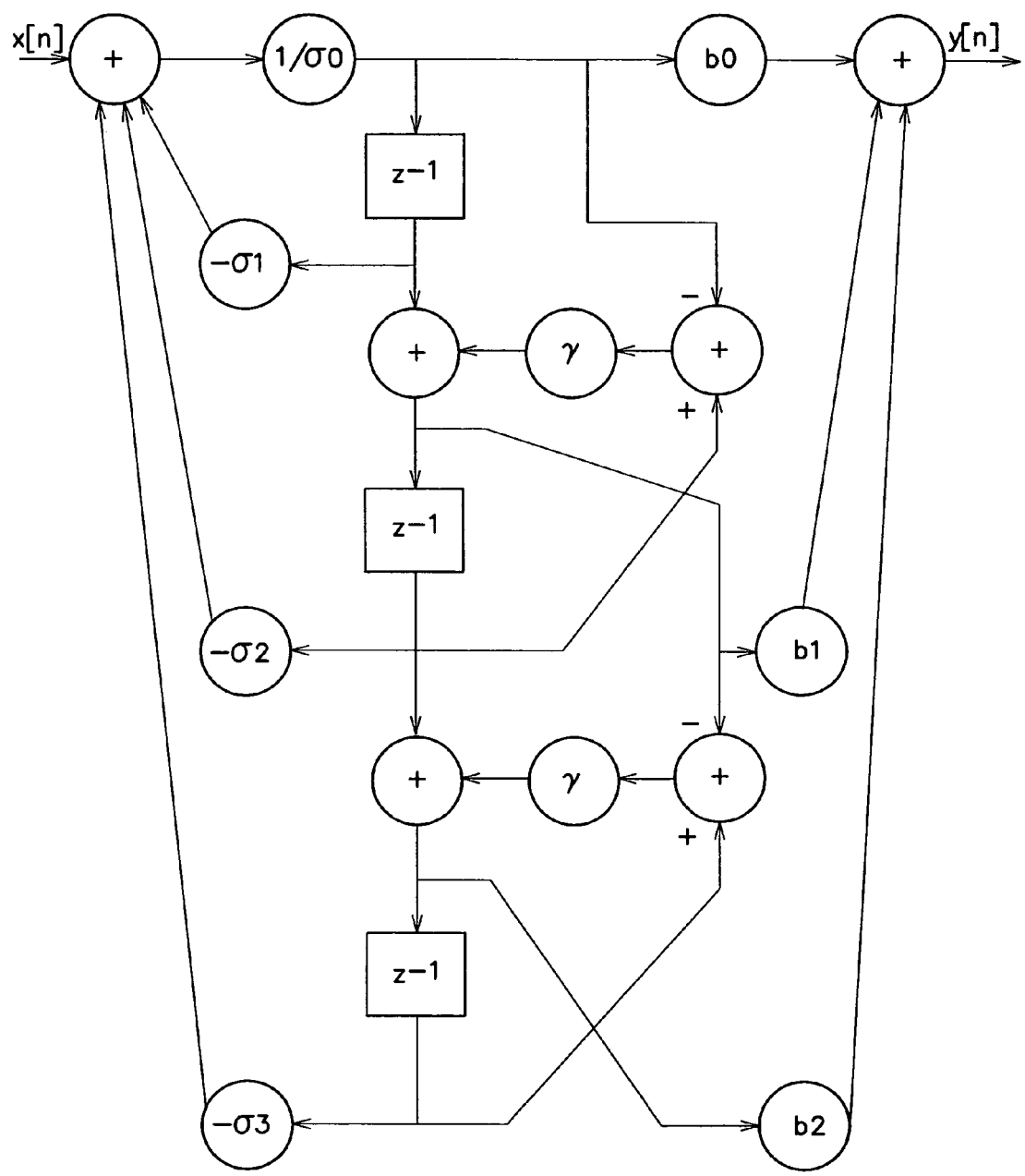
FIG. 13 is a detailed block diagram illustration of a computationally efficient embodiment of the second-order parametric IIR filter illustrated in FIG. 9.
Figure 14:
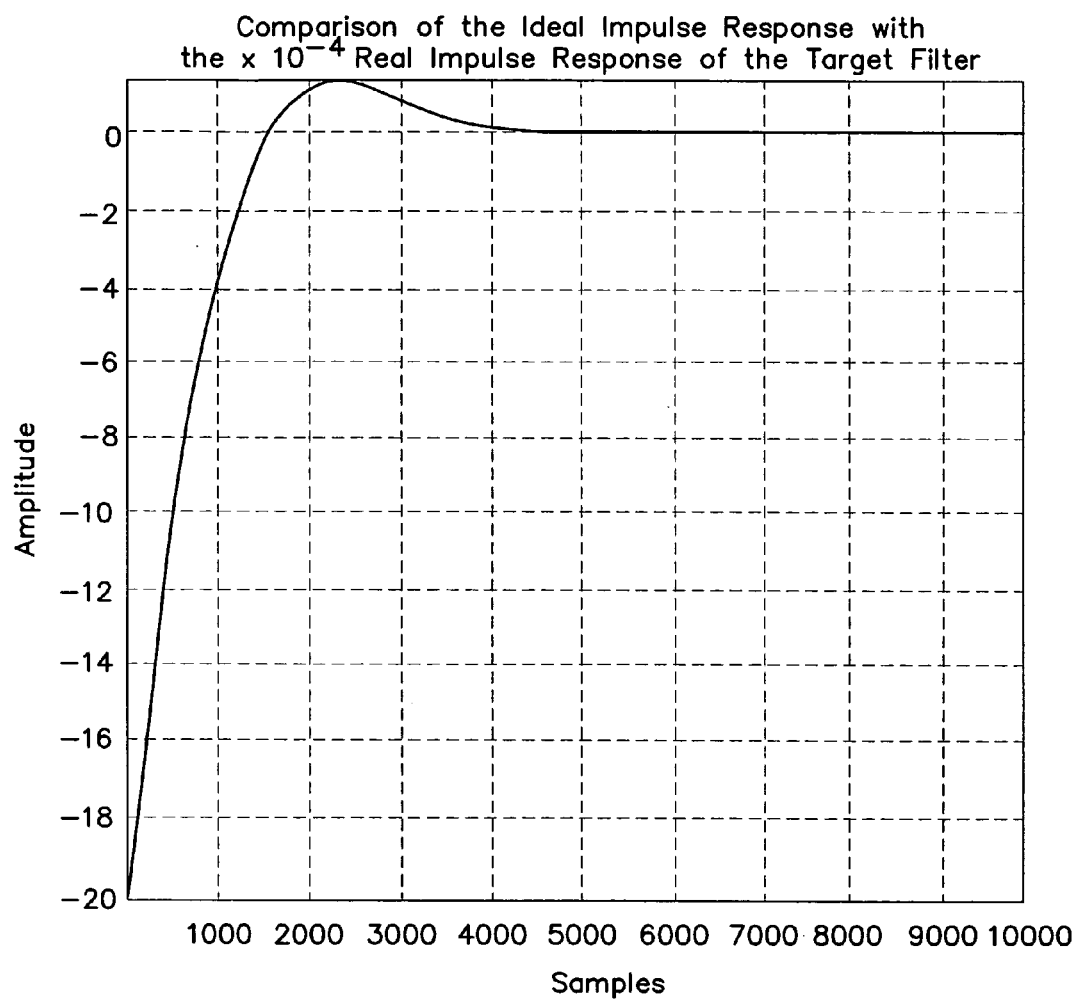
FIG. 14 is a graph illustrating the impulse response of a target filter for a second-order parametric IIR filter.
Figure 15:
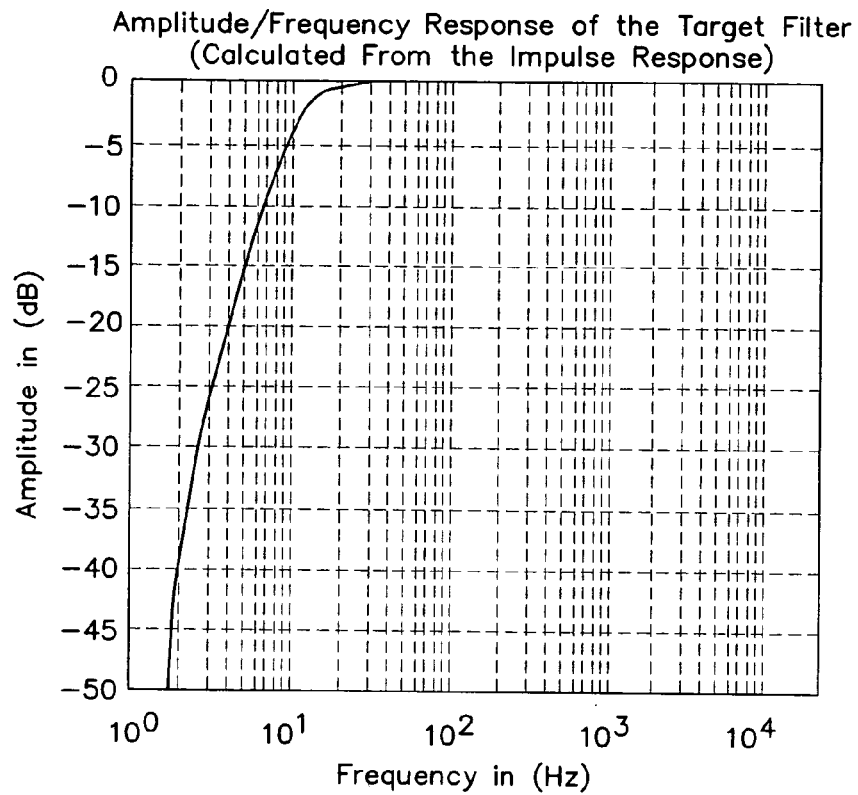
FIG. 15 is a graph illustrating the resultant amplitude/frequency response of the target filter.
Figure 16:
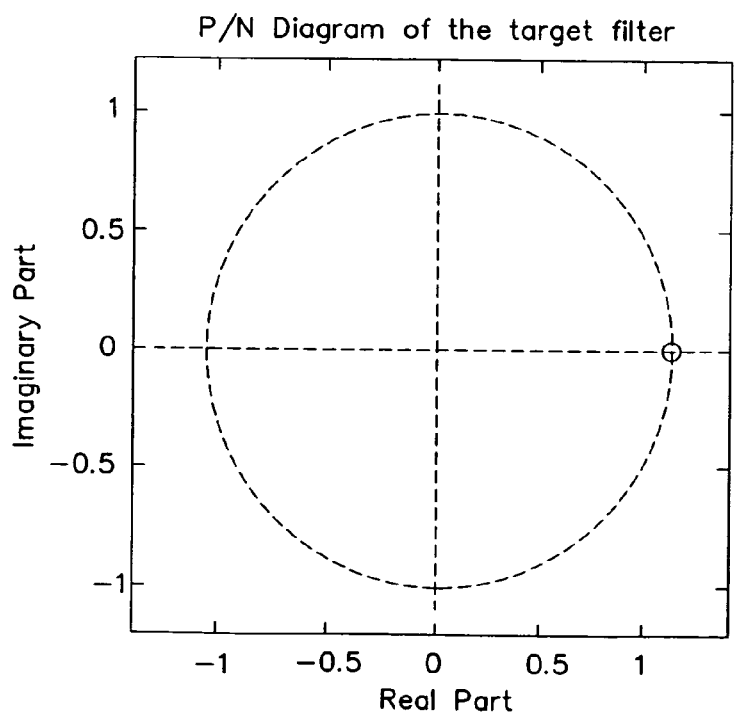
FIG. 16 is a graph illustrating the pole-zero diagram of the target filter.

FIG. 13 illustrates a computationally efficient embodiment of a second-order parametric IIR filter. This embodiment is obtained by expanding the arrangement according to FIG. 6 by one feedback network. From the second-order parametric IIR filter, the impulse response shown in FIG. 14 and the resultant amplitude/frequency response of the target filter shown in FIG. 15 is obtained. The associated pole-zero diagram of the target filter is shown in FIG. 16.

The digital filters may be implemented in microprocessors, signal processors, microcontrollers, computing devices et cetera. The individual filter components such as, for example, delay units, delay elements, coefficient sections are then hardware components of the microprocessors, signal processors, microcontrollers, computing devices, et cetera that are correspondingly used by the executable software.

The illustrations have been discussed with reference to functional blocks identified as modules and components that are not intended to represent discrete structures and may be combined or further sub-divided. In addition, while various embodiments of the invention have been described, it will be apparent to those of ordinary skill in the art that other embodiments and implementations are possible that are within the scope of this invention. Accordingly, the invention is not restricted except in light of the attached claims and their equivalents.

What is claimed is:

1. A parametric recursive digital filter having a cut-off/center frequency, the digital filter comprising:
   a delay unit having at least two delay elements and an interconnected phase network that includes a controllable phase angle, where the cut-off/center frequency of the digital filter is set as a function of the controllable phase angle;
   a positive feedback network connected to a first one of the delay elements creating a positive feedback path; and
   a feedback network connected to a second one of the delay elements creating a feedback path connected to the output of the second delay element in the delay unit.

2. The filter of claim 1, where a plurality of delay units are provided.

3. The filter of claim 2, where the delay units are identically designed and are controlled in the same manner.

4. The filter of claim 2, where each delay unit comprises at least two delay elements.

5. The filter of claim 2, where the positive feedback network comprises a plurality of positive feedback paths.

6. The filter according to claim 2, where the feedback network comprises a plurality of feedback paths.

7. The filter of claim 6, where a frequency-influencing filter unit is provided as delay unit.

8. The filter of claim 2, where two delay units comprising delay elements are interconnected with one another in such a manner that only a total of three delay elements are provided, one delay element being attributable to both delay units.

9. The filter of claim 1, where the delay unit comprises an all-pass filter.

10. The filter of claim 9, where the all-pass filter comprises:
    a first adder, one input of which forms an input of the all-pass filter,
    a second adder, the output of which forms an output of the all-pass filter,
    a coefficient section which is connected between the output of the first adder and a first input of the second adder,
    a first delay element which is connected between the input of the all-pass filter and a second input of the second adder,
    a second delay element which is connected between the output of the second adder and a second input of the first adder,
    the phase angle of the filter element being adjustable by changing the coefficient of the coefficient section, and
    the output of the first and/or second delay element being provided for connecting a feedback path.

* * * * *

UNITED STATES PATENT AND TRADEMARK OFFICE
CERTIFICATE OF CORRECTION

PATENT NO.         : 7,287,050 B2
APPLICATION NO. : 10/675600
DATED              : October 23, 2007
INVENTOR(S)     : Markus Christoph Page 1 of 1

It is certified that error appears in the above-identified patent and that said Letters Patent is hereby corrected as shown below:

<u>Column 5</u> line 36, delete "dependant" and insert --dependent--

Signed and Sealed this

Eighteenth Day of December, 2007

JON W. DUDAS
*Director of the United States Patent and Trademark Office*